US012580555B2

(12) United States Patent
Gaurav

(10) Patent No.: US 12,580,555 B2
(45) Date of Patent: Mar. 17, 2026

(54) PHASE INTERPOLATOR AND NON-OVERLAPPING CLOCK GENERATOR

(71) Applicant: QUALCOMM Incorporated, San Diego, CA (US)

(72) Inventor: Anand Gaurav, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 68 days.

(21) Appl. No.: 18/390,882

(22) Filed: Dec. 20, 2023

(65) Prior Publication Data

US 2025/0211211 A1     Jun. 26, 2025

(51) Int. Cl.
| | |
|---|---|
| *H03K 3/037* | (2006.01) |
| *H03K 3/012* | (2006.01) |
| *H03K 3/0233* | (2006.01) |
| *H03K 19/21* | (2006.01) |

(52) U.S. Cl.
CPC .......... *H03K 3/0375* (2013.01); *H03K 3/012* (2013.01); *H03K 3/02335* (2013.01); *H03K 19/21* (2013.01)

(58) Field of Classification Search
CPC .. H03K 3/0375; H03K 3/012; H03K 3/02335; H03K 19/21
See application file for complete search history.

(56) References Cited

U.S. PATENT DOCUMENTS

| | | | | |
|---|---|---|---|---|
| 8,081,024 B1* | 12/2011 | Evans | ...................... | H03K 5/13 |
| | | | | 327/175 |
| 9,160,345 B1* | 10/2015 | Gorecki | .................... | H04L 7/04 |
| 2023/0102952 A1* | 3/2023 | Tsai | ........................ | H03K 5/24 |
| | | | | 327/170 |

* cited by examiner

*Primary Examiner* — Sibin Chen
(74) *Attorney, Agent, or Firm* — Patterson & Sheridan LLP

(57) ABSTRACT

Certain aspects are directed towards an interpolator and/or a clock generator. An example interpolator generally includes: a first capacitive element; a first current source; a first switch coupled between the first capacitive element and the first current source; a second current source; a second switch coupled between the first capacitive element and the second current source; and a first comparison circuit having an input coupled to the first capacitive element.

23 Claims, 13 Drawing Sheets

400

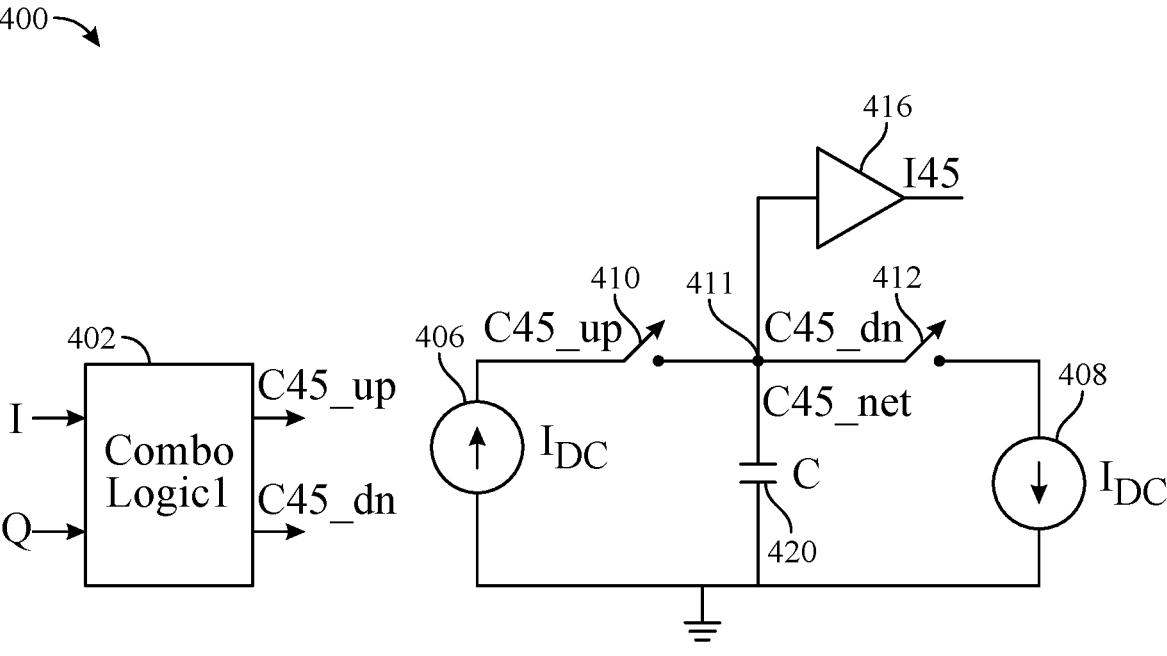
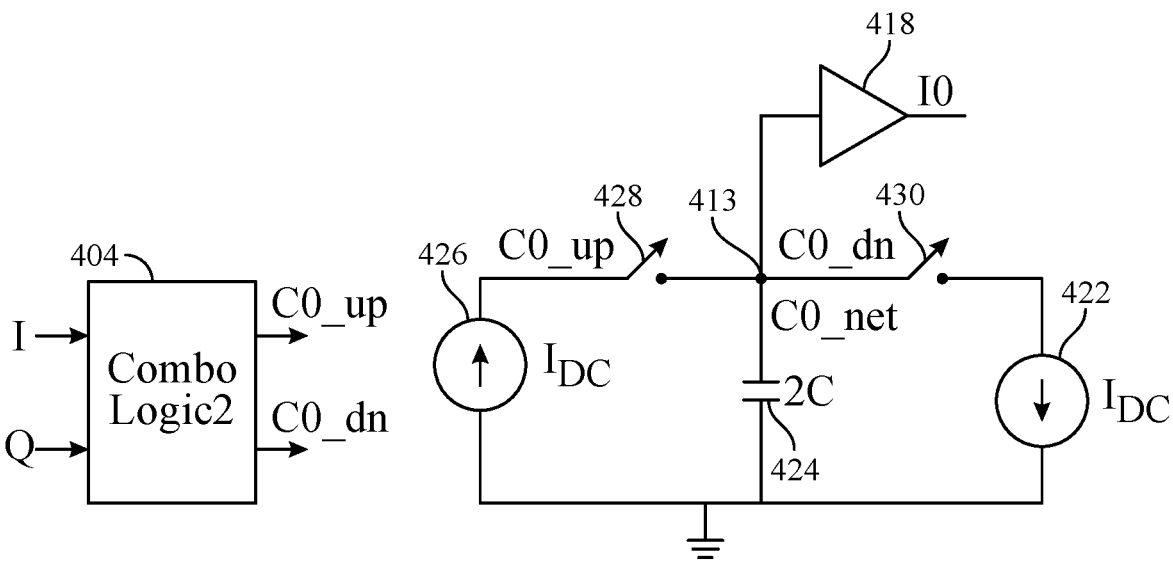
FIG. 4

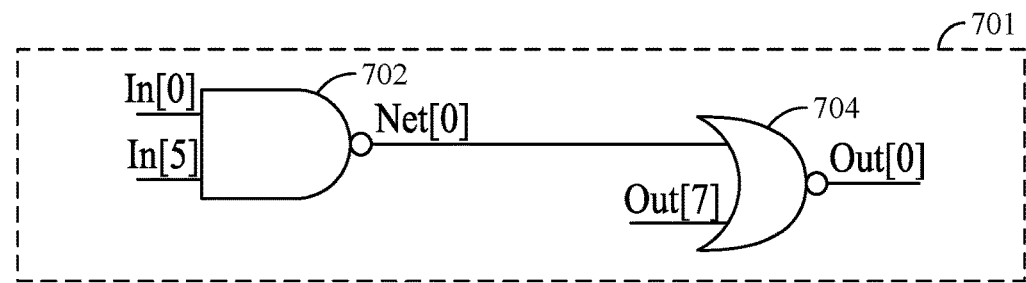
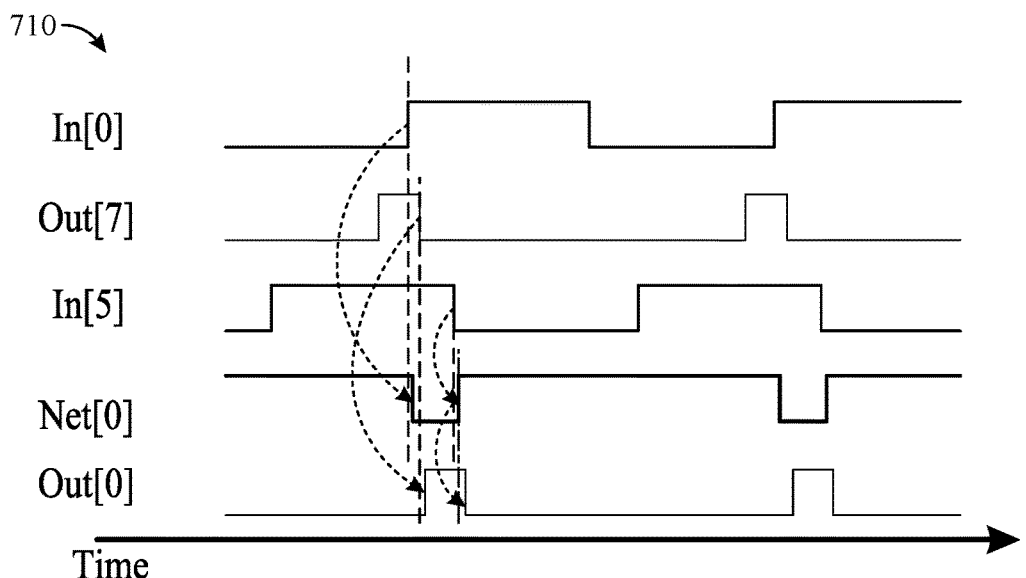
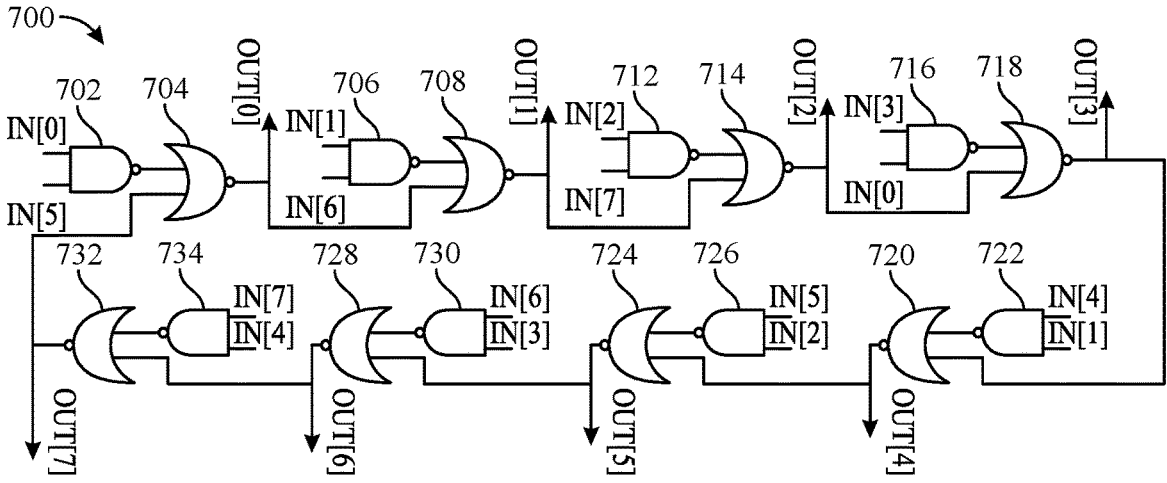
FIG. 7

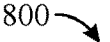
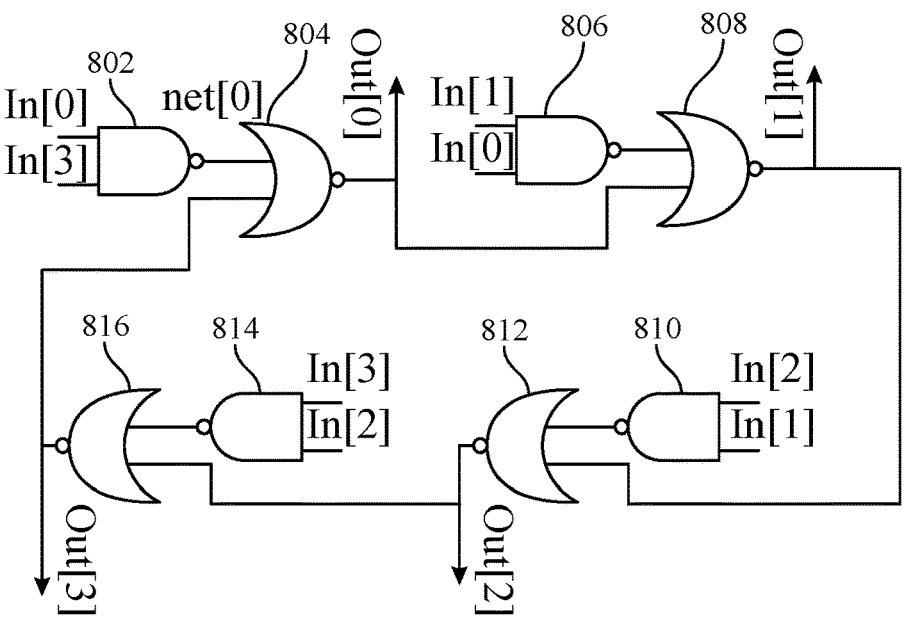
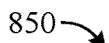
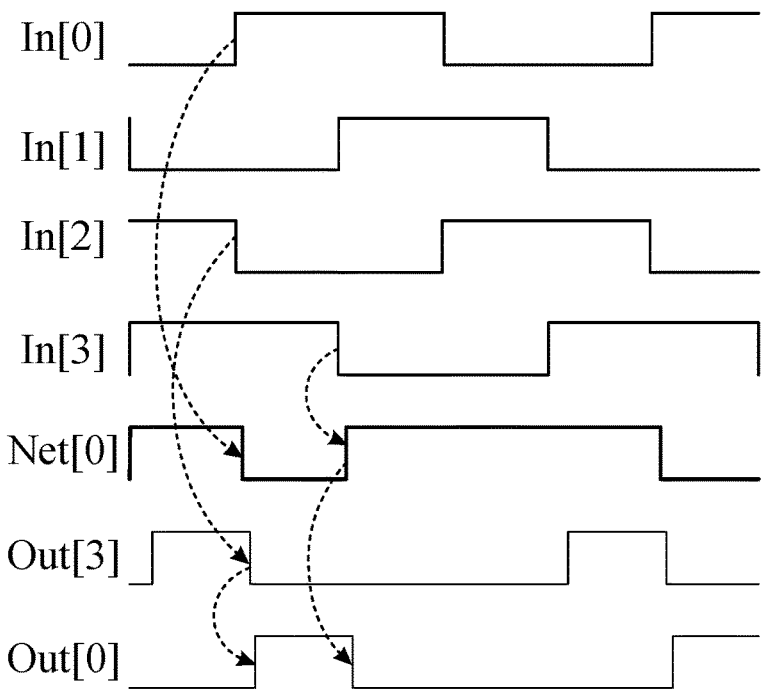
FIG. 8

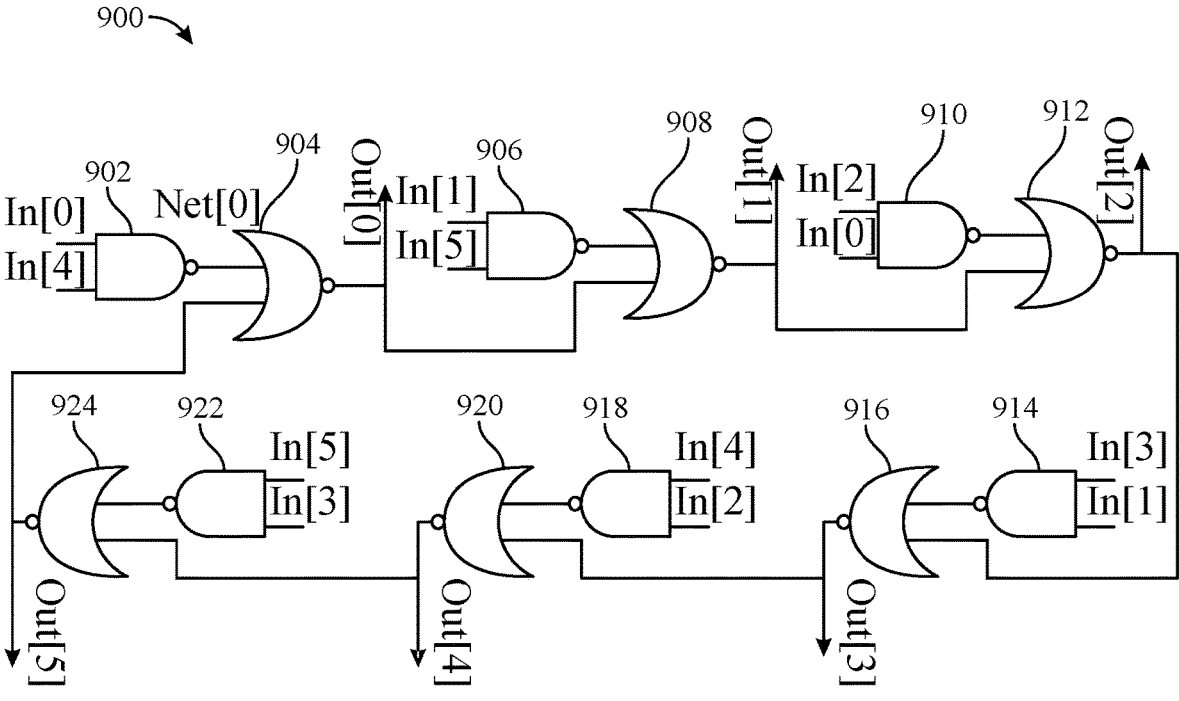
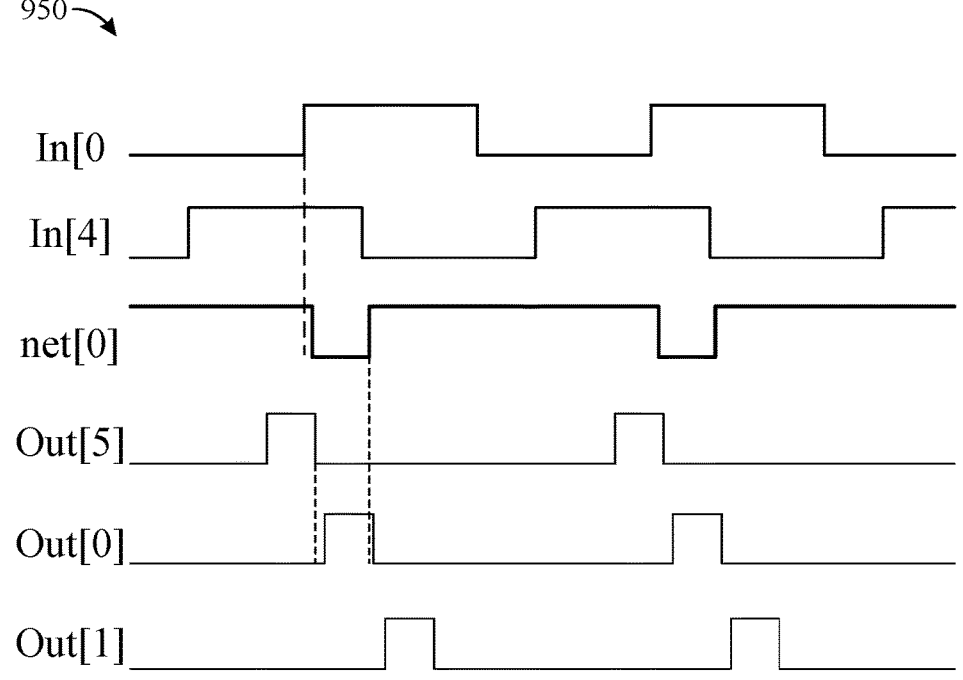
FIG. 9

1000 —◄

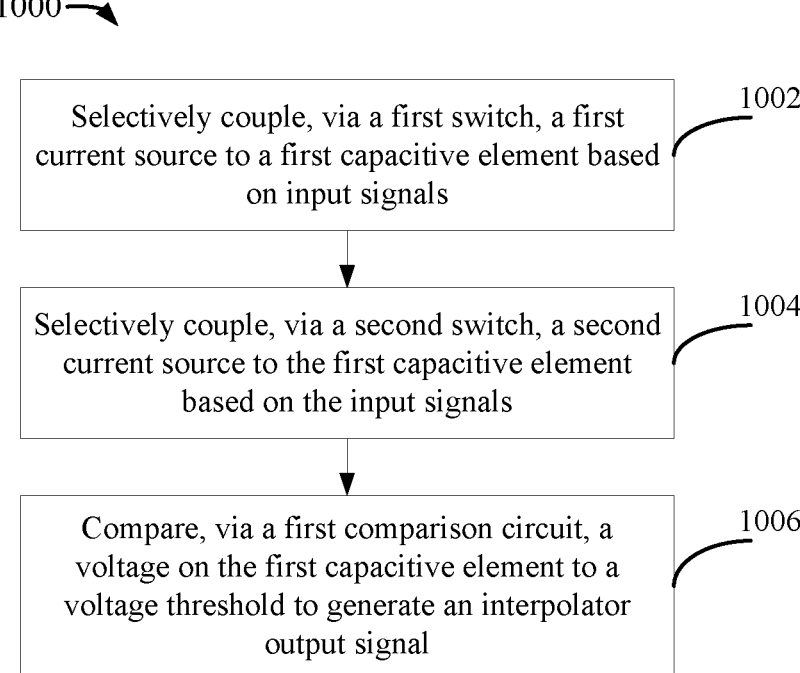

1002

Selectively couple, via a first switch, a first current source to a first capacitive element based on input signals

1004

Selectively couple, via a second switch, a second current source to the first capacitive element based on the input signals

1006

Compare, via a first comparison circuit, a voltage on the first capacitive element to a voltage threshold to generate an interpolator output signal

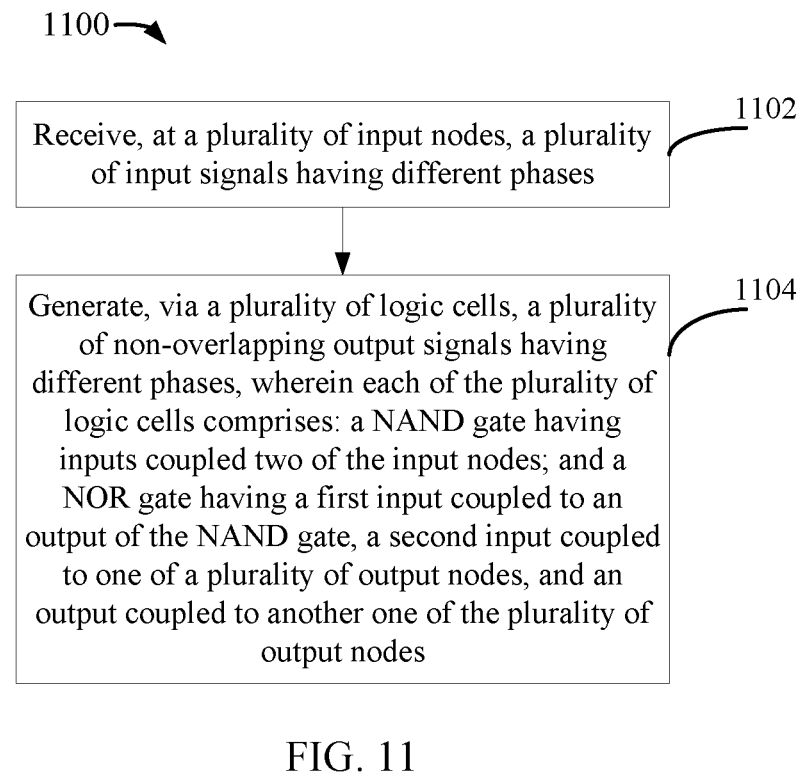

Receive, at a plurality of input nodes, a plurality of input signals having different phases — 1102

Generate, via a plurality of logic cells, a plurality of non-overlapping output signals having different phases, wherein each of the plurality of logic cells comprises: a NAND gate having inputs coupled two of the input nodes; and a NOR gate having a first input coupled to an output of the NAND gate, a second input coupled to one of a plurality of output nodes, and an output coupled to another one of the plurality of output nodes — 1104

FIG. 11

PHASE INTERPOLATOR AND NON-OVERLAPPING CLOCK GENERATOR

TECHNICAL FIELD

Certain aspects of the present disclosure generally relate to electronic circuits, and more particularly, to a phase interpolator and clock generator.

BACKGROUND

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include one or more filters for filtering signals and mixers for upconversion and downconversion of signals for transmission or reception, which may operate using signals of different phases.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects are directed towards an interpolator. The interpolator generally includes: a first capacitive element; a first current source; a first switch coupled between the first capacitive element and the first current source; a second current source; a second switch coupled between the first capacitive element and the second current source; and a first comparison circuit having an input coupled to the first capacitive element.

Certain aspects are directed towards a method for generating clock signals. The method generally includes: selectively coupling, via a first switch, a first current source to a first capacitive element based on input signals; selectively coupling, via a second switch, a second current source to the first capacitive element based on the input signals; and comparing, via a first comparison circuit, a voltage on the first capacitive element to a first voltage threshold to generate an interpolator output signal.

Certain aspects are directed towards a clock generator. The clock generator generally includes: a plurality of input nodes; a plurality of output nodes; and a plurality of logic cells, each of the plurality of logic cells comprising: a NAND gate having inputs coupled to two of the input nodes; and a NOR gate having a first input coupled to an output of the NAND gate, a second input coupled to one of the plurality of output nodes, and an output coupled to another one of the plurality of output nodes.

Certain aspects are directed towards a method for generating clock signals. The method generally includes: receiving, at a plurality of input nodes, a plurality of input signals having different phases; and generating, via a plurality of logic cells, a plurality of non-overlapping output signals having different phases, wherein each of the plurality of logic cells comprises: a NAND gate having inputs coupled to two of the input nodes; and a NOR gate having a first input coupled to an output of the NAND gate, a second input coupled to one of a plurality of output nodes, and an output coupled to another one of the plurality of output nodes.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIG. 4 illustrates an example interpolator, in accordance with certain aspects of the present disclosure.

FIG. 7 illustrates an example non-overlapping clock generator for eight clock phases, in accordance with certain aspects of the present disclosure.

FIG. 8 illustrates an example non-overlapping clock generator for four clock phases, in accordance with certain aspects of the present disclosure.

FIG. 9 illustrates an example non-overlapping clock generator for six clock phases, in accordance with certain aspects of the present disclosure.

FIG. 10 is a flow diagram illustrating example operations for clock signal generation via an interpolator, in accordance with certain aspects of the present disclosure.

FIG. 11 is a flow diagram illustrating example operations for clock signal generation via a clock generator, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to an interpolator and non-overlapping clock generator. In some aspects, the interpolator may receive clock signals with a first phase offset (e.g., 90° phase offset), based on which the interpolator may generate clock signals with a second phase offset (e.g., 45° phase offset) less than the first phase offset. The interpolator may include a capacitive element that may be charged and discharged. The voltage on the capacitive element may be compared to a threshold voltage (e.g., via an inverter) to generate an interpolator output signal. In some aspects, the clock generator may include logic cells (e.g., also referred to herein as "unit cells"), each having a not-AND (NAND) gate receiving input signals for the generator and a not-OR (NOR) gate having an input coupled to an output of the NAND gate and another input coupled to a first output of the generator. The output of the NOR gate may form a second output of the generator. In some aspects, the output of the NOR gate of one of the logic cells may be coupled to the second input of the NOR gate of a second one of the logic cells.

Certain aspects provide a multi-phase clock generator or quadrature clock generator, which may use a different architecture than ring oscillator or delay locked loops (DLL). Up and down current sources (e.g., similar to current sources for a charge pump used in phase-locked loops (PLLs)) may be used to charge and discharge a capacitive element to generate ramp up and ramp down signals used to interpolate and generate multi-phase clocks. Certain aspects may be used for any multi-phase circuit (e.g., in a system on chip (SoC)) such as wired data interfaces using multi-phase signals, multiplexer interfaces, n-path filters for radio frequency (RF) applications, or quadrature clock generation for RF mixers.

Example Wireless Communications

Figure 1:
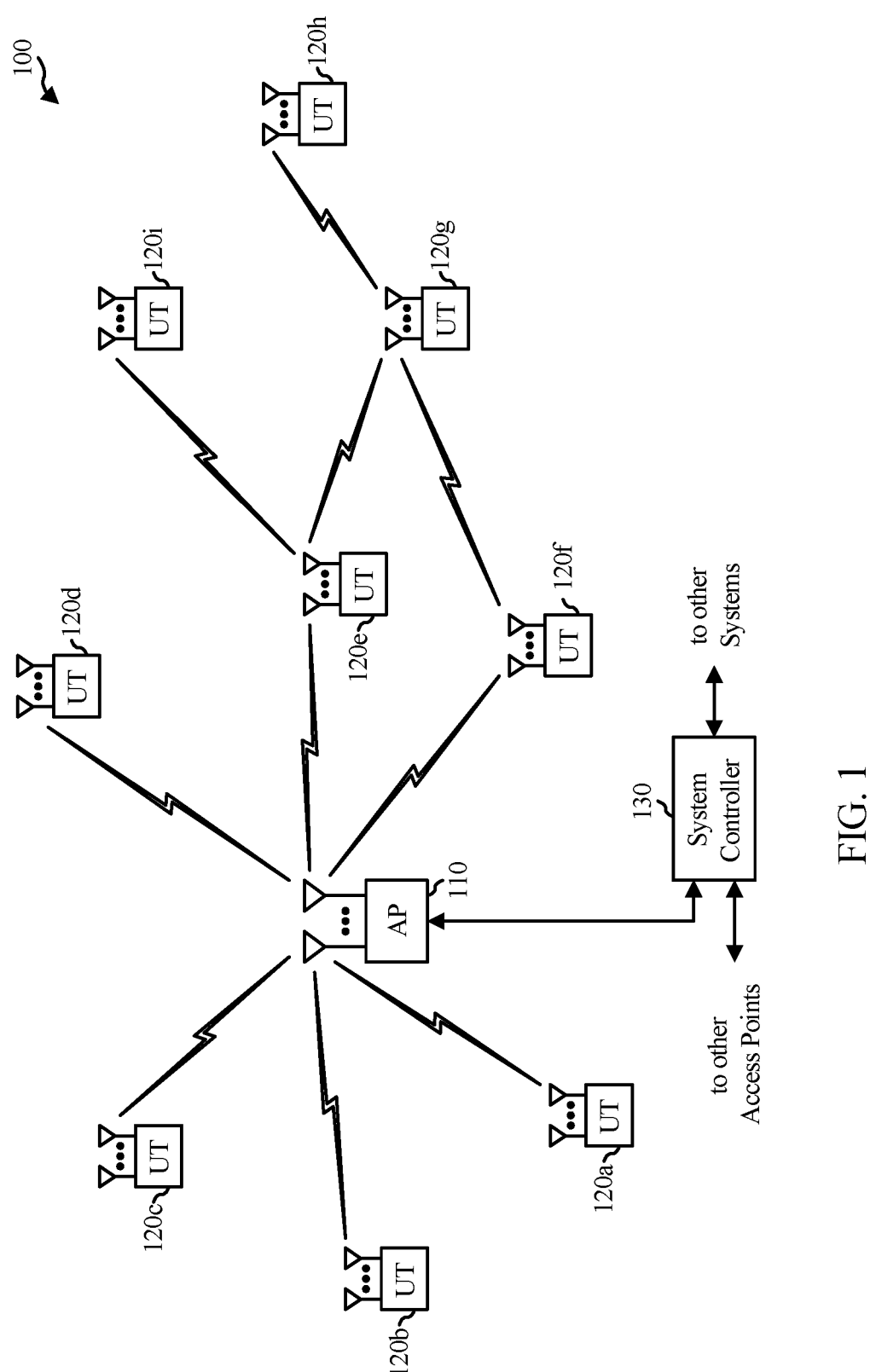
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). The user terminal 120 or access point 110 may include circuitry for phase interpolation and non-overlapping clock generation, as described in more detail herein.

Figure 2:
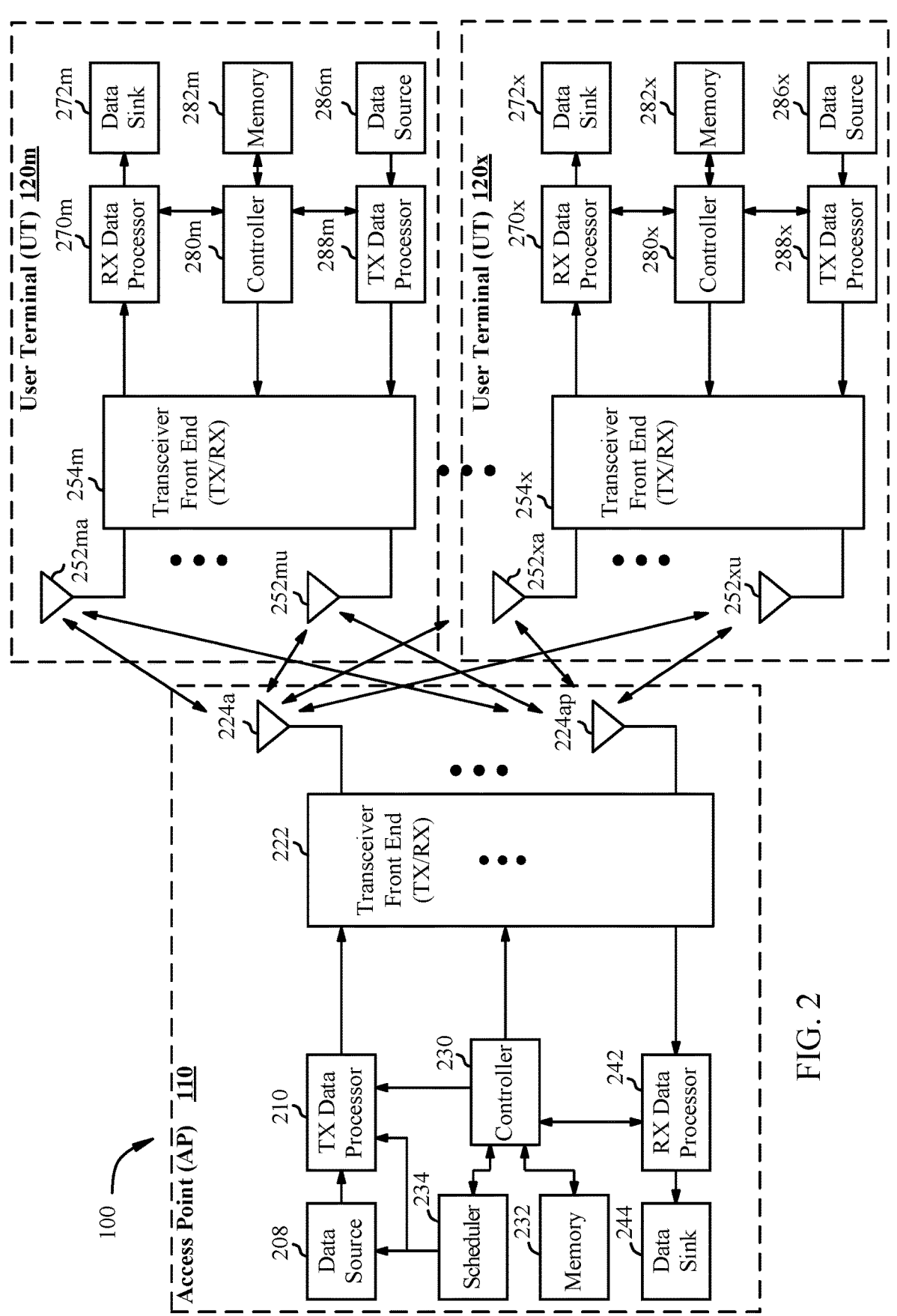
FIG. 2 is a block diagram of an example access point (AP) and example user terminals, in which aspects of the present disclosure may be practiced.

FIG. 2 shows a block diagram of access point 110 and two user terminals 120*m* and 120*x* in the wireless communications system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous reception on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a transmit (TX) data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity (e.g., best signal-to-noise ratio (SNR)). The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. A receive (RX) data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. The transceiver front end 222 or 254 may include may include circuitry for phase interpolation and non-overlapping clock generation, as described in more detail herein.

Figure 3:
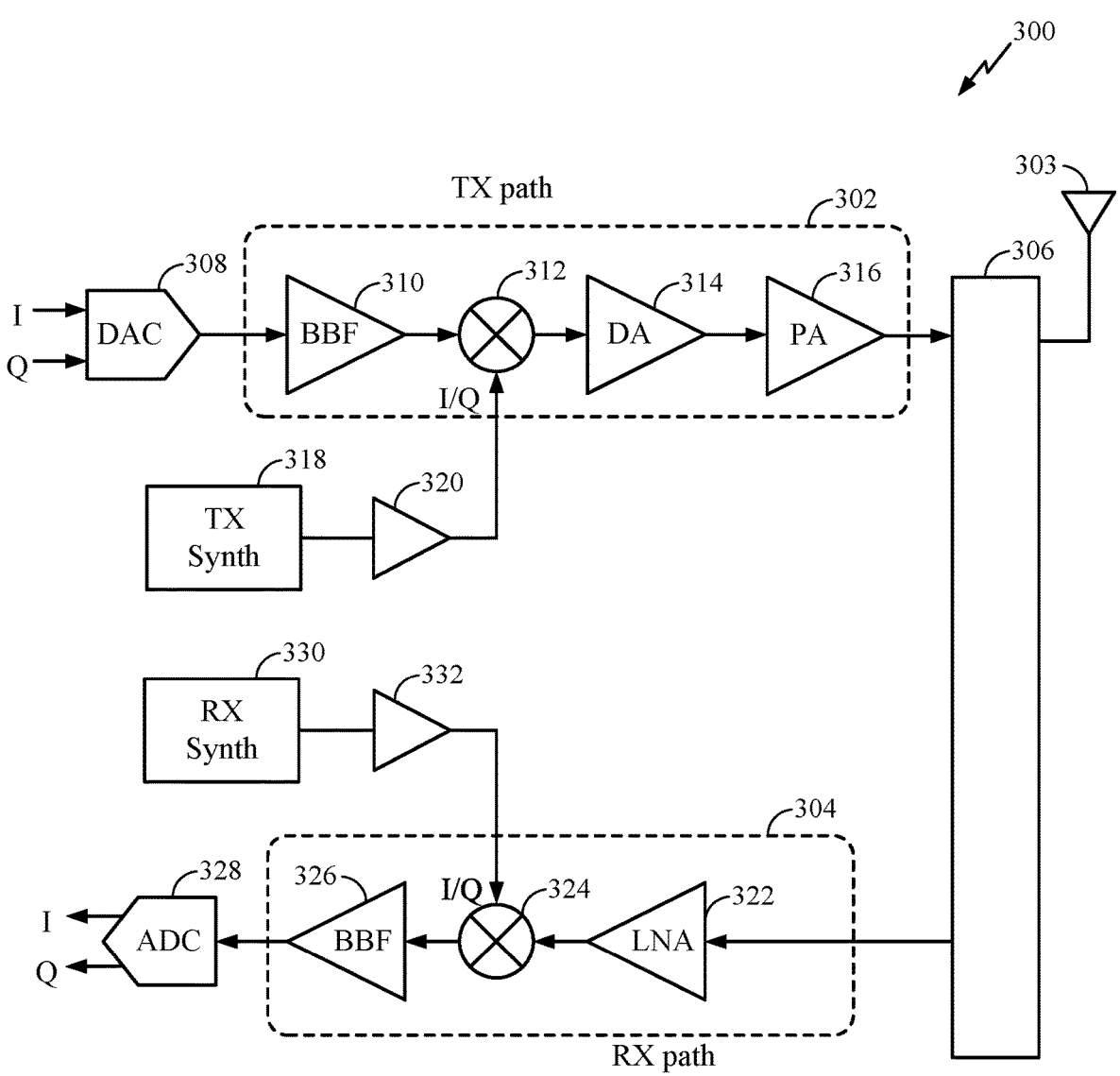
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a switch, a duplexer, a circulator, a diplexer, a multiplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC). For certain aspects, the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

The RX path 304 includes a low noise amplifier (LNA) 322, a mixer 324, and a baseband filter (BBF) 326. The LNA 322, the mixer 324, and the BBF 326 may be included in one or more RFICs, which may or may not include the same RFIC that comprises the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324. For certain aspects, a single frequency synthesizer may be used for both the TX path 302 and the RX path 304. In certain aspects, the TX frequency synthesizer 318 and/or the RX frequency synthesizer 330 may include a frequency multiplier, such as a frequency doubler, that is driven by an oscillator (e.g., a VCO) in the frequency synthesizer.

A controller (e.g., controller 280 in FIG. 2) may direct the operation of the transceiver front end 300, such as transmitting signals via the TX path 302 and/or receiving signals via the RX path 304. The controller may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory (e.g., memory 282 in FIG. 2) may store data and/or program codes for operating the transceiver front end 300. The controller and/or the memory may include control logic (e.g., complementary metal-oxide-semiconductor (CMOS) logic or other digital logic circuitry). In some aspects, the transceiver front end 300 may include one or more filters (e.g., filter 310 or filter 326) and/or mixers (e.g., mixer 312 or mixer 324) that may be operated using non-overlapping clock signals of different phases generated using an interpolator and a clock generator, as described in more detail herein.

While FIGS. 1-3 provide wireless communications as an example application in which certain aspects of the present disclosure may be implemented to facilitate understanding, certain aspects described herein may be used for non-overlapping clock signal generation in any of various other suitable systems (e.g., ultrasound transmitters and receivers).

Example Interpolator and Clock Generator

Certain aspects of the present disclosure are directed toward techniques for generating phase-shifted signals. The phase-shifted signals may be non-overlapping signals, in some aspects. In some applications, the phase-shifted signals may be used for a mixer or an N-path filter (e.g., a filter having N filter paths, N being a positive integer). The filter may receive non-overlapping clock signals that are 45° apart in phase. The clock signals may be generated from four signals that are 90° apart in phase. Some conventional implementations use delay-locked loops (DLLs) to generate the multi-phase clock signals. A DLL has feedback loop(s) which when locked, set the correct phase relationship of the output clock signals. However, the loops of the DLL can be power hungry to reduce noise and may have instability issues. Certain aspects of the present disclosure are directed towards a low-power interpolator and non-overlapping clock generator. The interpolator provides a more simple design than a DLL for performing phase interpolation and non-overlapping clock generation. While some examples provided herein are described for the generation of eight clock phases to facilitate understanding, certain aspects of the present disclosure may be applied to generating any suitable number of clock phases. The present disclosure provides an efficient and robust interpolator and clock generator design with lower power and area consumption.

FIG. 4 illustrates an example interpolator 400, in accordance with certain aspects of the present disclosure. As shown in FIG. 4, the interpolator 400 includes a capacitive element 420 (e.g., having a capacitance C) selectively coupled to current sources 406, 408 through respective switches 410, 412. The current source 406 sources a direct-current (DC) current (e.g., labeled $I_{DC}$) to the capacitive element 420 when the switch 410 is closed, and the current source 408 sinks $I_{DC}$ from the capacitive element 420 when the switch 412 is closed. As shown, the switch 410 may be controlled by a C45_up signal (e.g., charging switch control signal for 45° phase signal generation), and the switch 412 may be controlled by a C45_dn signal (e.g., discharging switch control signal for 45° phase signal generation), which are generated using combination logic 402 (e.g., labeled "Combo Logic1") based on in-phase (I) and quadrature (Q) signals. A signal C45_net is generated at a node 411 between the switches 410, 412. The interpolator 400 includes an inverter 416 having an input coupled to the node 411, where a clock phase (I45) is generated at an output of the inverter 416.

Similarly, the interpolator 400 includes a capacitive element 424 (e.g., having a capacitance 2C, twice the capacitance of the capacitive element 420) selectively coupled to current sources 426, 422 through respective switches 428, 430. The current source 426 sources Ipc to the capacitive element 424 when the switch 428 is closed, and the current source 422 sinks $I_{DC}$ from the capacitive element 424 when the switch 430 is closed. As shown, the switch 428 may be controlled by a C0_up signal (e.g., charging switch control signal for 0° phase signal generation), and the switch 430 may be controlled by a C0_dn signal (e.g., discharging switch control signal for 0° phase signal generation), which are generated using combination logic 404 (e.g., labeled "Combo Logic2") based on the I and Q signals. A signal C0_net is generated at a node 413 between the switches 428, 430. The interpolator 400 includes an inverter 418 having an input coupled to the node 413, where a clock phase (I0) is generated at an output of the inverter 418. The clock phase I0 may have a phase that is offset by 45° from the signal I45 generated at the output of inverter 416. While circuitry for generating two phases (e.g., I0 and I45 signals) are described, the circuitry described with respect to FIG. 4 may be only a part of an interpolator used to generate eight phases as described in more detail with respect to FIG. 6.

Figure 5:
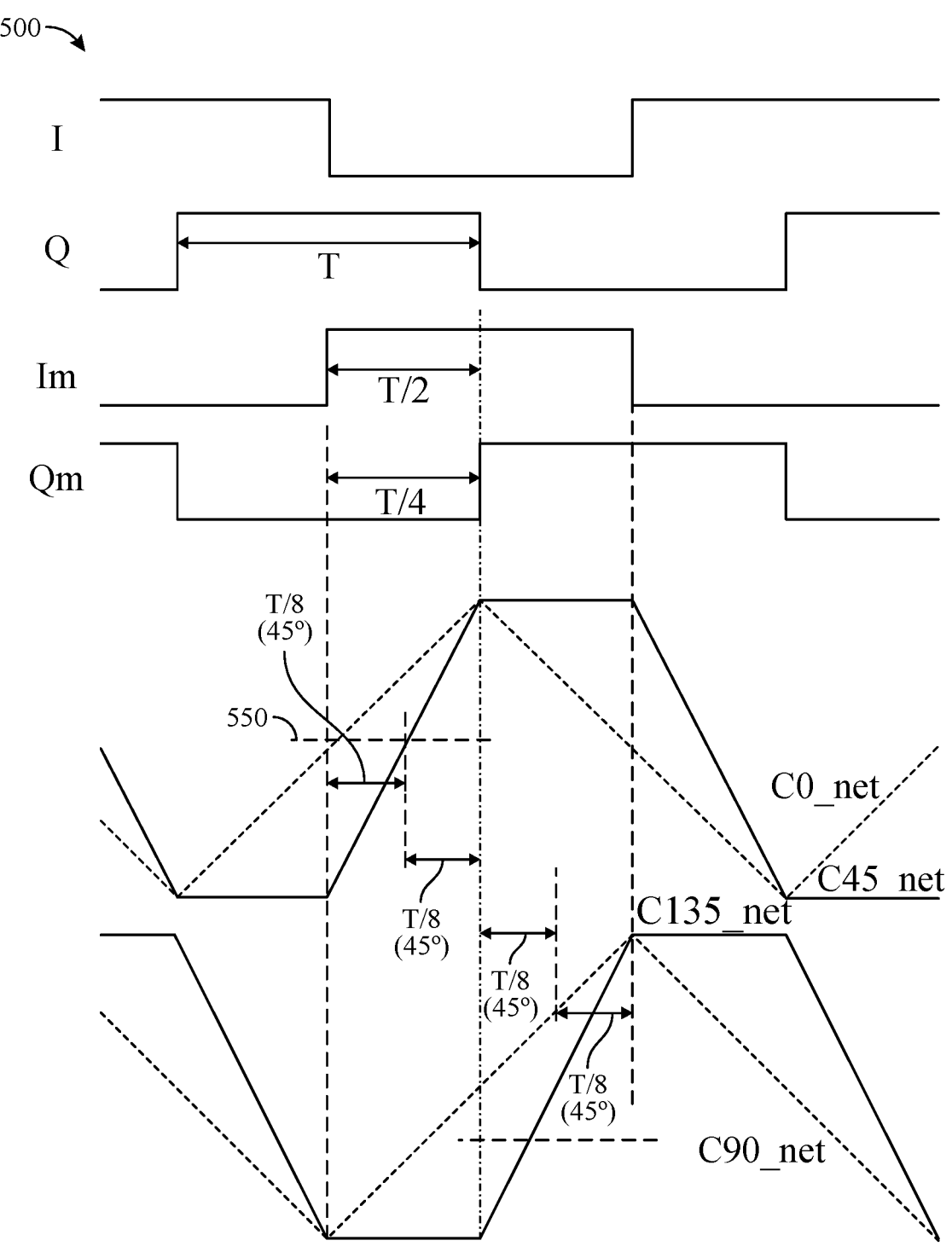
FIG. 5 is a timing diagram illustrating waveforms used to generate clock phases via an interpolator, in accordance with certain aspects of the present disclosure.

FIG. 5 is a timing diagram 500 illustrating waveforms used to generate clock phases via the interpolator 400, in accordance with certain aspects of the present disclosure. The positive I signal (labeled "I" in FIG. 5, also referred to herein as "Ip signal"), the positive Q signal (labeled "Q," also referred to herein as a "Qp signal"), the negative I signal (labeled "Im" in FIG. 5) and the negative Q signal (labeled "Qm" in FIG. 5) each have a period T. As shown, the C0_net signal increases for a time T/2 (e.g., starting from the rising edge of the Q signal) and decreases for a time T/2. Starting from the rising edge of the Q signal, the C45_net signal remains constant (e.g., at 0 volts) for a time T/4, increases for a time T/4, stays constant (e.g., at a supply voltage Vdd) for a time T/4, and then decreases for a time T/4, as shown. In a similar manner as generating the C0_net and C45_net signals, a C90_net signal and a C135_net signal are generated. The C90_net signal increases for a time T/2 (e.g., starting from the rising edge of the Im signal) and decreases for a time T/2. Starting from the rising edge of the Im signal, the C135_net signal remains constant (e.g., at 0 volts) for a time T/4, increases for a time T/4, stays constant (e.g., at a supply voltage Vdd) for a time T/4, and then decreases for a time T/4, as shown. Each of the C0_net, C45_net, C90_net, and C135_net signals are provided to an inverter for generating respective 0°, 45°, 90°, and 135° clock phases. For example, the inverter 416 receives the C45_net signal, where the output of the inverter 416 is logic high when the C45_net signal is less than a voltage threshold ($V_{TH}$) (e.g., voltage threshold 550 shown in FIG. 5) and may be logic low when the C45_net signal is greater than the voltage threshold. The inverter 416 may operate from the supply voltage Vdd, and the voltage threshold 550 may be about half of the supply voltage Vdd. The two-to-one (2:1) ratio of slopes of the net signals (e.g., C0_net and C45_net) allows for the generation of signals with different phases and with a 45° phase offset. The different slopes are implemented using different capacitance values (e.g., different capacitances of capacitive elements 420, 424). As shown, the c45_net signal increases from 0 volts to Vth in a period of T/8.

Figure 6A:
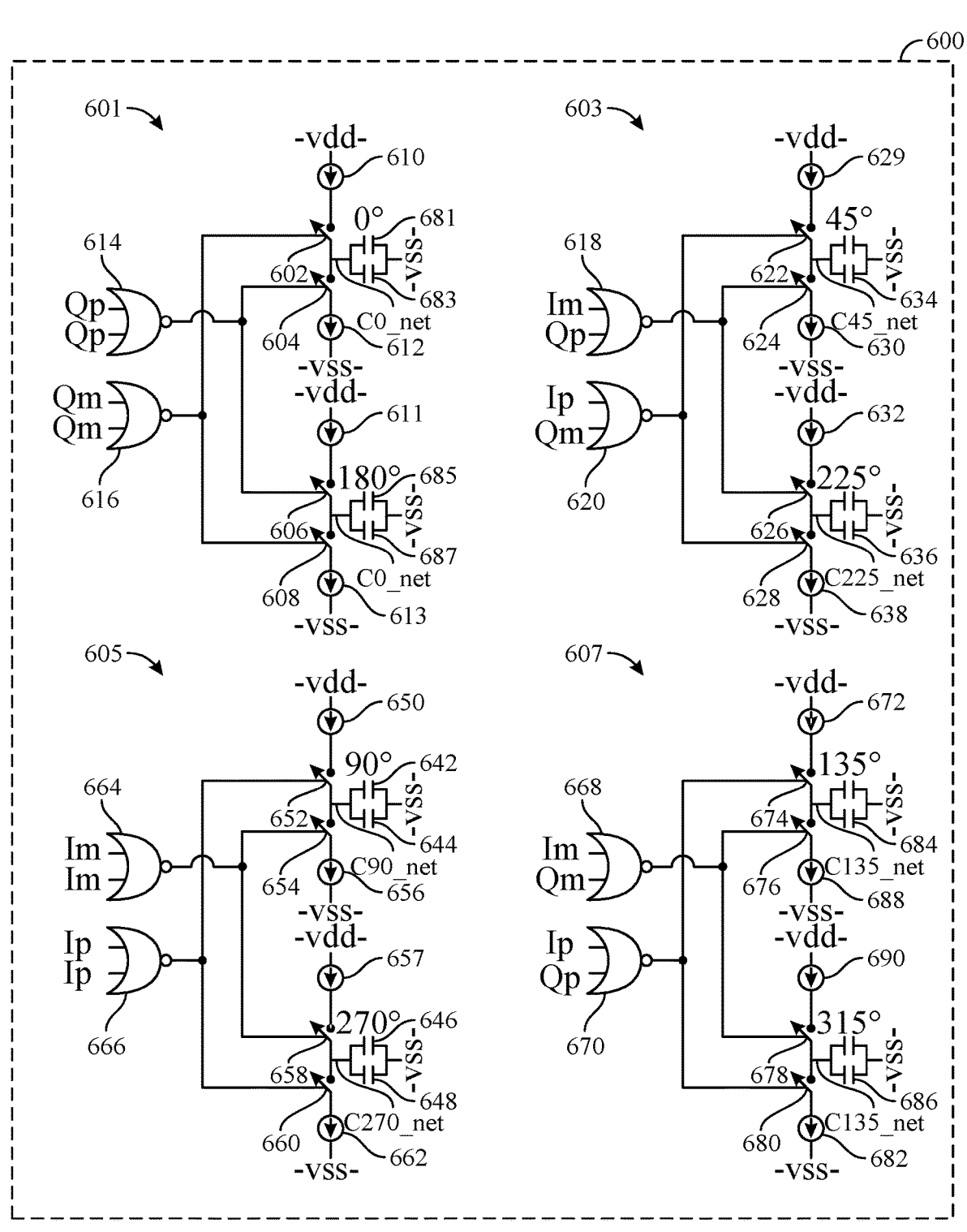
FIG. 6A illustrates an example interpolator used to generate signals of different phases, in accordance with certain aspects of the present disclosure.

FIG. 6A illustrates an interpolator 600 (e.g., corresponding to interpolator 400) for generating eight clock phases, in accordance with certain aspects of the present disclosure. As shown, the interpolator 600 includes a circuit 601 for generating the C0_net signal (e.g., for generating an I0 signal having a 0° phase) and a C180_net signal (e.g., for generating an I180 signal having a 180° phase offset from the I0 signal). The circuit 601 includes switches 602, 604 (e.g., corresponding to switches 428, 430 of FIG. 4) coupled to capacitive elements 681, 683. The switches 602, 604 selectively couple current sources 610, 612, respectively, to capacitive elements 681, 683. The capacitive elements 681, 683 are coupled in parallel, and each has a capacitance C, providing a total capacitance of 2C (e.g., used to implement the capacitive element 424 of FIG. 4). The C0_net signal is generated at a node between the switches 602, 604, based on which the I0 signal may be generated using an inverter (e.g., inverter 418 of FIG. 4, not shown in FIG. 6). The circuit 601 also includes switches 606, 608 coupled to capacitive elements 685, 687. The switches 606, 608 selectively couple the current sources 611, 613, respectively, to capacitive elements 685, 687. The capacitive elements 685, 687 are coupled in parallel and each has a capacitance C, providing a total capacitance of 2C. A C180_net signal is generated at a node between the switches 606, 608, based on which the I180 signal may be generated using an inverter (not shown in FIG. 6) as described herein.

As shown, the circuit 601 includes NOR gates 614, 616 (e.g., corresponding to logic 404). The NOR gate 614 may receive as inputs the Qp signals, and the NOR gate 616 may receive as inputs the Qm signals. The NOR gate 614 may generate an output signal to control switches 604, 606, and the NOR gate 616 may generate an output signal to control switches 602, 608, charging and discharging the capacitive elements 681, 683 to generate the C0_net signal and charging and discharging the capacitive elements 685, 687 to generate the C180_net signal.

In a similar manner, a circuit 603 in the interpolator 600 may be used to generate the C45_net signal (e.g., for generating the I45 signal having a 45° phase offset from the I0 signal) and a C225_net signal (e.g., for generating an I225 signal having a 225° phase offset from the I0 signal). The circuit 603 includes switches 622, 624 (e.g., corresponding to switches 410, 412 of FIG. 4) coupled to capacitive element 634 (e.g., corresponding to capacitive element 420 of FIG. 4). The switches 622, 624 selectively couple the current sources 629, 630, respectively, to capacitive element 634. The capacitive element 634 has a capacitance C. The C45_net signal is generated at a node between the switches 622, 624, based on which the I45 signal may be generated using an inverter (e.g., inverter 416 of FIG. 4, not shown in FIG. 6). The circuit 603 also includes switches 626, 628 coupled to capacitive element 636 having a capacitance C. The switches 626, 628 selectively couple current sources 632, 638, respectively, to capacitive element 636. The C225_net signal is generated at a node between the switches 626, 628, based on which the I225 signal may be generated using an inverter (not shown in FIG. 6) as described herein.

As shown, the circuit 603 includes NOR gates 618, 620. The NOR gate 618 may receive as inputs the Im and Qp signals, and the NOR gate 620 may receive as inputs the Ip and Qm signals. The NOR gate 618 may generate an output signal to control switches 624, 626, and the NOR gate 620 may generate an output signal to control switches 622, 628, charging and discharging the capacitive element 634 to generate the C45_net signal and charging and discharging the capacitive element 636 to generate the C225_net signal.

A circuit 605 in the interpolator 600 may be used to generate the C90_net signal (e.g., for generating an I90 signal having a 90° phase offset from the I0 signal) and a C270_net signal (e.g., for generating an I270 signal having a 270° phase offset from the I0 signal). The circuit 605 includes switches 652, 654 coupled to parallel capacitive elements 642, 644, each having a capacitance C. The switches 652, 654 selectively couple current sources 650, 656, respectively, to capacitive elements 642, 644. The C90_net signal is generated at a node between the switches 652, 654, based on which the I90 signal may be generated using an inverter (e.g., not shown in FIG. 6). The circuit 605 also includes switches 658, 660 coupled to parallel capacitive elements 646, 648, each having a capacitance C. The switches 658, 660 selectively couple the current sources 657, 662, respectively, to capacitive elements 646, 648. The C270_net signal is generated at a node between the switches 658, 660, based on which the I270 signal may be generated using an inverter (not shown in FIG. 6) as described herein.

As shown, the circuit 605 includes NOR gates 664, 666. The NOR gate 664 may receive as inputs the Im signal, and the NOR gate 666 may receive as inputs the Ip signal. The NOR gate 664 may generate an output signal to control switches 654, 658, and the NOR gate 666 may generate an output signal to control switches 652, 660, charging and discharging the capacitive elements 642, 644 to generate the C90_net signal and charging and discharging the capacitive elements 646, 648 to generate the C270_net signal.

A circuit 607 in the interpolator 600 may be used to generate the C135_net signal (e.g., for generating an I135 signal having a 135° phase offset from the I0 signal) and a C315_net signal (e.g., for generating an I315 signal having a 315° phase offset from the I0 signal). The circuit 607 includes switches 674, 676 coupled to capacitive element 684 having a capacitance C. The switches 674, 676 selectively couple current sources 672, 688, respectively, to capacitive element 684. The C135_net signal is generated at a node between the switches 674, 676, based on which the I135 signal may be generated using an inverter (e.g., not shown in FIG. 6). The switches 674, 676 selectively couple the current sources 672, 688, respectively, to capacitive element 684. The circuit 607 also includes switches 678, 680 coupled to capacitive element 686 having a capacitance C. The switches 678, 680 selectively couple current sources 690, 682, respectively, to capacitive element 686. A C315_net signal is generated at a node between the switches 678, 680, based on which the I315 signal may be generated using an inverter (not shown in FIG. 6) as described herein.

As shown, the circuit 607 includes NOR gates 668, 670. The NOR gate 668 may receive as inputs the Im and Qm signals, and the NOR gate 670 may receive as inputs the Ip and Qp signals. The NOR gate 668 may generate an output signal to control switches 676, 678, and the NOR gate 670 may generate an output signal to control switches 674, 680, charging and discharging the capacitive element 684 to generate the C135_net signal and charging and discharging the capacitive element 686 to generate the C315_net signal.

In this manner, from the four phases Ip, Im, Qp, and Qm, eight different phases having a 45° phase offset therebetween may be generated.

Figure 6B:
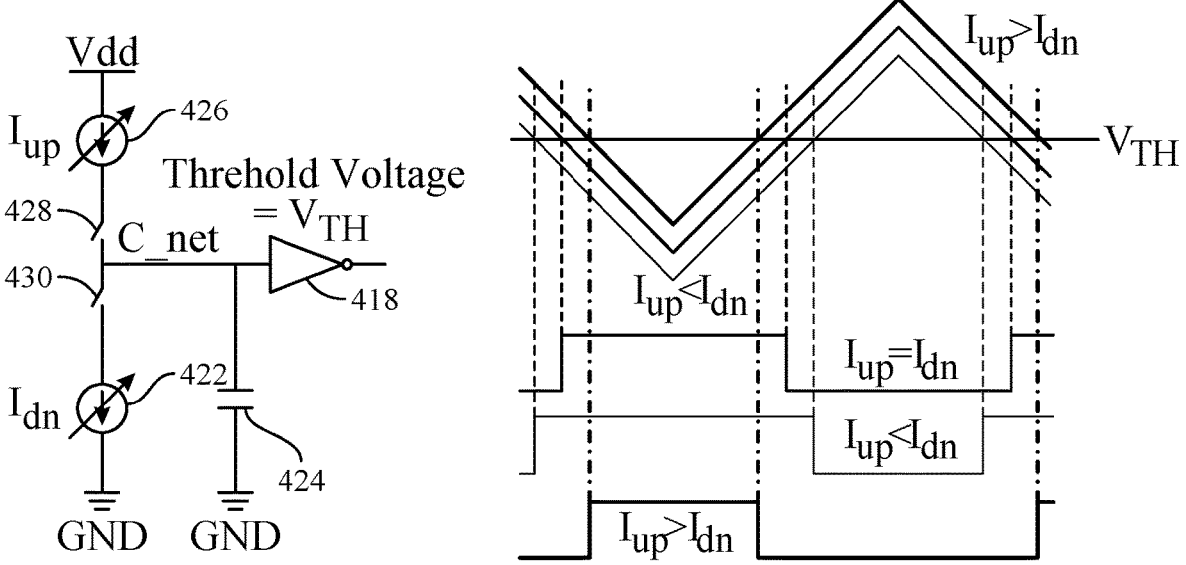
FIG. 6B illustrates example techniques for adjusting a duty cycle of a clock signal, in accordance with certain aspects of the present disclosure.

FIG. 6B illustrates example techniques for adjusting a duty cycle of a clock signal, in accordance with certain aspects of the present disclosure. The current setting of the current sources used to charge and discharge the capacitive element to generate the net signals (e.g., C0_net, C45, net, and so on) may be adjusted to adjust the duty cycle of the generated clock signals. For instance, as shown, the current ($I_{up}$) sourced by current source 426 (e.g., used to charge capacitive element 424 when switch 428 is closed) may be set to be greater than the current ($I_{dn}$) sunk by current source 422 (e.g., used to discharge capacitive element 424 when switch 430 is closed), generating the C0_net signal 603. The C0_net signal 603 is compared to a threshold voltage ($V_{TH}$) (e.g., of a field-effect transistor (FET) in inverter 418), resulting in a clock signal 615 being generated having less than a 50% duty cycle at the output of inverter 418. As shown, when $I_{up}$ is equal to Ian, the C0_net signal 605 is generated, resulting in a clock signal 609 being generated at the output of inverter 418 having about a 50% duty cycle. When $I_{up}$ is less than $I_{dn}$, the C45_net signal 607 is generated, resulting in a clock signal 697 being generated at the output of inverter 418 having greater than a 50% duty cycle, as depicted. Typically, duty cycle may be adjusted by inserting a programmable delay stage in the signal-path which adds to noise and power consumption. Thus, without using such a delay stage, certain aspects of the present disclosure reduce noise and power consumption of the interpolator.

FIG. 7 illustrates an example non-overlapping clock generator 700 for generating eight different, non-overlapping clock phases, in accordance with certain aspects of the present disclosure. The clock generator 700 may receive eight overlapping clock phases (e.g., input signals In[0] to In[7]) and generate eight non-overlapping clock phases (e.g., output signals Out[0] to Out[7]). Non-overlapping clock signals refer to clock signals that are logic high at different times, with no two clock signals both being logic high at the same time. The inputs In[0] to In[7] may be 45° phase offset signals, which may be generated via the interpolator 600 as described herein. For instance, In[0] may be an I0 signal, In[1] may be an I45 signal, In[2] may be an I90 signal, In[3] may be an I135 signal, In[4] may be an I180 signal, In[5] may an I225 signal, In[6] may be an I270 signal, and In[7] may an I315 signal.

The clock generator 700 may be implemented using eight unit cells, such as an example unit cell 701. The unit cell 701 includes a NAND gate 702 configured to generate a Net[0] signal (e.g., an intermediate net signal) provided to a first input of a NOR gate 704, where a second input of the NOR gate 704 receives Out[7]. A first input of the NAND gate 702 may receive In[0], and a second input of the NAND gate 702 may receive In[5]. An output of the NOR gate 704 (and an output of the unit cell 701) may be Out[0].

As shown in timing diagram 710, Out[0] transitions from logic low to logic high after Out[7] has already transitioned from logic high to logic low—and Out[0] has already transitioned from logic high to logic low before Out[7] transitions from logic low to logic high—so that Out[0] and Out[7] are non-overlapping. Net[0] at the output of the NAND gate 702 is logic low only when both In[0] and In[5] are logic high. Thus, when In[0] transitions from logic low to logic high, Net[0] transitions to logic low, and when In[5] transitions from logic high to logic low, Net[0] transitions back to logic high, causing Out[0] to also transition from logic high back to logic low, as shown.

This process is performed using respective unit cells for each of the output signals. For example, Out[0] may be provided to a first input of a NOR gate 708, where a second input of the NOR gate 708 is coupled to an output of a NAND gate 706 having inputs receiving In[1] and In[6]. The NOR gate 708 generates Out[1] based on Out[0] and the output signal of NAND gate 706. Out[1] may be provided to a first input of a NOR gate 714, where a second input of the NOR gate 714 is coupled to an output of a NAND gate 712 having inputs receiving In[2] and In[7]. The NOR gate 714 generates Out[2] based on Out[1] and the output signal of NAND gate 712. Similarly, NOR gate 718 generates Out[3] based on Out[2] and the output signal of NAND gate 716 receiving as inputs In[3] and In[0]. NOR gate 720 generates Out[4] based on Out[3] and the output signal of NAND gate 722 receiving as inputs In[4] and In[1]. NOR gate 724 generates Out[5] based on Out[4] and the output signal of NAND gate 726 receiving as inputs In[5] and In[2]. NOR gate 728 generates Out[6] based on Out[5] and the output signal of NAND gate 730 receiving as inputs In[6] and In[3]. NOR gate 732 generates Out[7] based on Out[6] and the output signal of NAND gate 734 receiving as inputs In[7] and In[4].

While an example non-overlapping clock generator is described for eight clock phases to facilitate understanding, certain aspects of the present disclosure may be applied for generating any number of non-overlapping clock phases, such as four clock phases or six clock phases. For example, the generator may be implemented for generating 2N phase clocks, N being a positive integer. The first NAND gate of the generator (e.g., NAND gate 702) receives as inputs In[0] and In[N+1]. That is, for eight phases, N is equal to 4, and thus, NAND gate 702 receives In[0] and In[5], as described. The subsequent NAND gate in the chain of unit cells receives In[1] and In[N+2], and so on.

FIG. 8 illustrates an example non-overlapping clock generator 800 for generating four different, non-overlapping clock phases, in accordance with certain aspects of the present disclosure. The clock generator 800 may receive four overlapping clock phases (e.g., input signals In[0] to In[3]) and generate four non-overlapping clock phases (e.g., output signals Out[0] to Out[3]). The inputs In[0] to In[3] may be 90° phase offset signals. The generator 800 includes a NOR gate 804 that generates Out[0] based on Out[3] and the output signal of NAND gate 802 receiving as inputs In[0] and In[3]. NOR gate 808 generates Out[1] based on Out[0] and the output signal of NAND gate 806 receiving as inputs In[1] and In[0]. NOR gate 812 generates Out[2] based on Out[1] and the output signal of NAND gate 810 receiving as inputs In[2] and In[1]. NOR gate 816 generates Out[3] based on Out[2] and the output signal of NAND gate 814 receiving as inputs In[3] and In[2].

As shown in timing diagram 850, Out[0] transitions from logic low to logic high after Out[3] has already transitioned from logic high to logic low—and Out[0] has already transitioned from logic high to logic low before Out[3] transitions from logic low to logic high-so that Out[0] and Out[3] are non-overlapping. Net[0] at the output of NAND gate 802 is logic low only when both In[0] and In[3] are logic high. Thus, when In[0] transitions from logic low to logic high, Net[0] transitions to logic low, and when In[3] transitions from logic high to logic low, Net[0] transitions back to logic high, causing Out[0] to also transition from logic high back to logic low, as shown.

FIG. 9 illustrates an example non-overlapping clock generator 900 for generating six different, non-overlapping clock phases, in accordance with certain aspects of the present disclosure. The clock generator 900 may receive six overlapping clock phases (e.g., input signals In[0] to In[5]) and generate six non-overlapping clock phases (e.g., output signals Out[0] to Out[5]). The generator 900 includes a NOR gate 904 that generates Out[0] based on Out[5] and the output signal of NAND gate 902 receiving as inputs In[0] and In[4]. NOR gate 908 generates Out[1] based on Out[0] and the output signal of NAND gate 906 receiving as inputs In[1] and In[5]. NOR gate 912 generates Out[2] based on Out[1] and the output signal of NAND gate 910 receiving as inputs In[2] and In[0]. NOR gate 916 generates Out[3] based on Out[2] and the output signal of NAND gate 914 receiving as inputs In[3] and In[1]. NOR gate 920 generates Out[4] based on Out[3] and the output signal of NAND gate 918 receiving as inputs In[4] and In[2]. NOR gate 924 generates Out[5] based on Out[4] and the output signal of NAND gate 922 receiving as inputs In[5] and In[3].

As shown in timing diagram 950, Out[0] transitions from logic low to logic high after Out[5] has already transitioned from logic high to logic low—and Out[0] has already transitioned from logic high to logic low before Out[5] transitions from logic low to logic high—so that Out[0] and Out[5] are non-overlapping. Similarly, Out[1] transitions from logic low to logic high after Out[0] has already transitioned from logic high to logic low—and Out[1] has already transitioned from logic high to logic low before Out[0] transitions from logic low to logic high-so that Out[0] and Out[1] are non-overlapping. Net[0] at the output of NAND gate 902 is logic low only when both In[0] and In[4] are logic high. Thus, when In[0] transitions from logic low to logic high, Net[0] transitions to logic low and when In[4] transitions from logic high to logic low, Net[0] transitions back to logic high, causing Out[0] to also transition from logic high back to logic low, as shown.

Example Clock-Generating Operations

FIG. 10 is a flow diagram illustrating example operations 1000 for generating clock signals, in accordance with certain aspects of the present disclosure. The operations 1000 may be performed by an interpolator (e.g., interpolator 400 or interpolator 600), and in some aspects, a clock generator (e.g., clock generator 700, 800, or 900).

At block 1002, the interpolator may selectively couple, via a first switch (e.g., switch 622), a first current source (e.g., current source 629) to a first capacitive element (e.g., capacitive element 634) based on input signals. At block 1004, the interpolator may selectively couple, via a second switch (e.g., switch 624), a second current source (e.g., current source 630) to the first capacitive element based on the input signals. At block 1006, the interpolator may compare, via a first comparison circuit (e.g., inverter 416), a voltage on the first capacitive element to a first voltage threshold to generate an interpolator output signal.

In some aspects, the interpolator may charge, via the first current source, the first capacitive element when the first switch is closed (and the second switch is open) and discharge, via the second current source, the first capacitive element when the second switch is closed (and the first switch is open). In some aspects, the interpolator controls signals for the first switch and the second switch based on at least one of a positive in-phase (I or Ip) signal, a negative I (Im) signal, a positive quadrature (Q or Qp) signal, and a negative Q (Qm) signal.

In some aspects, the interpolator generates, via a first logic gate (e.g., NOR gate 618), a first control signal for the second switch (e.g., switch 624) and a third switch (e.g., switch 626); generates, via a second logic gate, a second control signal for the first switch (e.g., switch 622) and a fourth switch (e.g., switch 628); selectively couples, via the third switch, a third current source (e.g., current source 632) to a second capacitive element (e.g., capacitive element 636); selectively couples, via the fourth switch, a fourth current source (e.g., current source 638) to the second capacitive element; and compares, via a second comparison circuit (e.g., an inverter, not shown, but similar to inverter 416), a voltage on the second capacitive element to a second voltage threshold.

In some aspects, the interpolator controls, via a first NOR gate (e.g., NOR gate 618), the second switch based on a negative I signal and a positive Q signal, and controls, via a second NOR gate (e.g., NOR gate 620), the first switch based on a positive I signal and a negative Q signal. In some aspects, the interpolator controls, via a first NOR gate (e.g., NOR gate 668), the second switch (e.g., switch 676) based on a negative I signal and a negative Q signal, and controls, via a second NOR gate (e.g., NOR gate 670), the first switch (e.g., switch 674, 680) based on a positive I signal and a positive Q signal.

In some aspects, the interpolator selectively couples, via a third switch (e.g., switch 652), a third current source (e.g., current source 650) to a second capacitive element (e.g., formed by parallel capacitive elements 642, 644); selectively couples, via a fourth switch (e.g., switch 654), a fourth current source (e.g., current source 656) to the second capacitive element; and compares, via a second comparison circuit, a voltage on the second capacitive element to a second voltage threshold. In some aspects, the interpolator controls, via a first logic gate (e.g., NOR gate 664), the fourth switch based on a positive Q signal, and controls, via a second logic gate (e.g., NOR gate 666), the third switch based on a negative Q signal. In some aspects, the interpolator controls, via a first logic gate (e.g., NOR gate 664), the fourth switch (e.g., switch 654) based on a negative I signal, and controls, via a second logic gate (e.g., NOR gate 666), the third switch (e.g., switch 652) based on a positive I signal. The second capacitive element may have a capacitance that is twice a capacitance of the first capacitive element.

In some aspects, the clock generator may receive, at a plurality of input nodes, a plurality of input signals having different phases, the plurality of input nodes being coupled to respective outputs of the interpolator including the first switch, the second switch, and the first comparison circuit.

In some aspects, the clock generator may generate, via a plurality of logic cells (e.g., unit cell 701), a plurality of non-overlapping output signals having different phases. Each of the plurality of logic cells may include a NAND gate (e.g., NAND gate 702) having inputs coupled to two of the input nodes and a NOR gate (e.g., NOR gate 704) having a first input coupled to an output of the NAND gate, a second input coupled to one of a plurality of output nodes, and an output coupled to another one of the plurality of output nodes.

FIG. 11 is a flow diagram illustrating example operations 1100 for generating clock signals, in accordance with certain aspects of the present disclosure. The operations 1100 may be performed by a clock generator (e.g., clock generator 700, 800, or 900).

At block 1102, the clock generator receives, at a plurality of input nodes, a plurality of input signals having different phases. At block 1104, the clock generator generates, via a plurality of logic cells, a plurality of non-overlapping output signals having different phases.

Each of the plurality of logic cells may include a NAND gate (e.g., NAND gate 702) having inputs coupled to two of the input nodes and a NOR gate (e.g., NOR gate 704) having a first input coupled to an output of the NAND gate, a second input coupled to one of a plurality of output nodes (e.g., Out[7]), and an output coupled to another one of the plurality of output nodes (e.g., Out[0]). In some aspects, the output of the NOR gate of a first one of the plurality of logic cells is coupled to the second input of the NOR gate of a second one of the plurality of logic cells.

In some aspects, the non-overlapping clock signals generated by the clock generator may be provided to an N-path filter. The N-path filter may include switches that may be controlled by the clock signals to selectively couple an output node to a respective capacitive element for filtering. However, the clock signals may be used for any suitable application that receives non-overlapping clock signals of different phases. For example, the clock signals may be used to operate a mixer (e.g., mixer 312 or 324 of FIG. 3).

Figure 12:
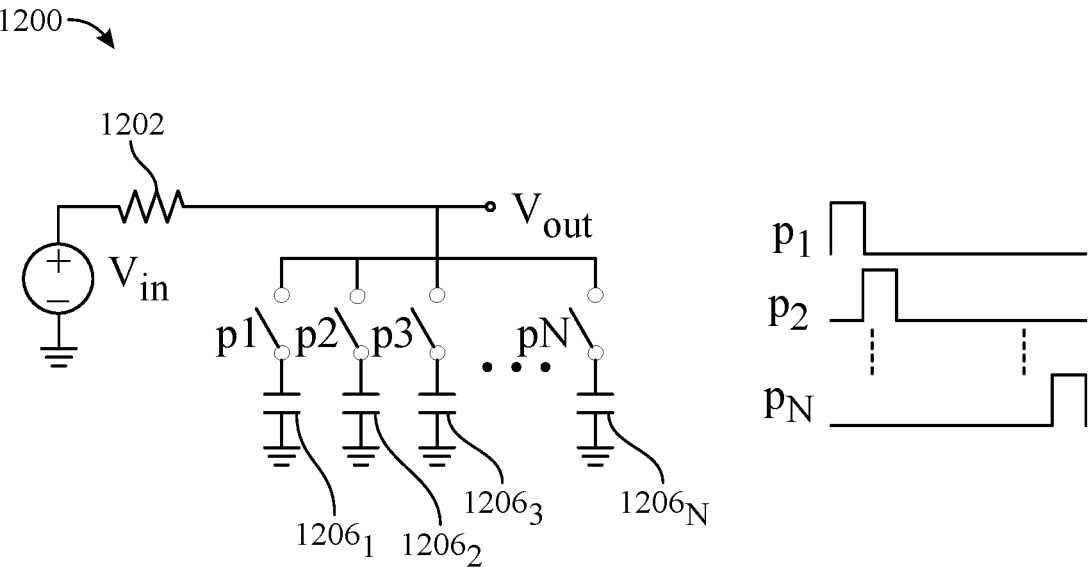
FIG. 12 illustrates an example filter controlled by non-overlapping clock signal, in accordance with certain aspects of the present disclosure.

FIG. 12 illustrates an example N-path filter 1200 controlled by non-overlapping clock signals, in accordance with certain aspects of the present disclosure. As shown, the filter 1200 may include an input voltage source (Vin) coupled to an output voltage (Vout) node of the filter 1200 through a resistive element 1202. Multiple switches receiving clock signals of different phases labeled "p1" to "pN" may selectively couple the Vout node to respective capacitive elements $1206_1$ to $1206_N$, generating a filtered output voltage at the Vout node. As shown, the clock signals are non-overlapping clock signals, which may be generated by a clock generator, such as the clock generator 700, 800, or 900.

Example Aspects

Aspect 1: An interpolator, comprising: a first capacitive element; a first current source; a first switch coupled between the first capacitive element and the first current source; a second current source; a second switch coupled between the first capacitive element and the second current source; and a first comparison circuit having an input coupled to the first capacitive element.

Aspect 2: The interpolator of Aspect 1, wherein the first current source is configured to source a current to the first capacitive element when the first switch is closed; and the second current source is configured to sink a current from the first capacitive element when the second switch is closed.

Aspect 3: The interpolator of Aspect 1 or 2, wherein the first comparison circuit comprises an inverter.

Aspect 4: The interpolator according to any of Aspects 1-3, further comprising logic having inputs coupled to input nodes of the interpolator and outputs coupled to control inputs of the first switch and the second switch, wherein the logic is configured to generate control signals provided to the first switch and the second switch based on at least one of a positive in-phase (I) signal, a negative I signal, a positive quadrature (Q) signal, or a negative Q signal.

Aspect 5: The interpolator according to any of Aspects 1-4, further comprising: a second capacitive element; a third current source; a third switch coupled between the second capacitive element and the third current source; a fourth current source; a fourth switch coupled between the second capacitive element and the fourth current source; a second comparison circuit having an input coupled to the second capacitive element; a first logic gate configured to control the second switch and the third switch; and a second logic gate configured to control the first switch and the fourth switch.

Aspect 6: The interpolator according to any of Aspects 1-5, further comprising: a first NOR gate configured to control the second switch based on a negative in-phase (I) signal and a positive quadrature (Q) signal; and a second NOR gate configured to control the first switch based on a positive I signal and a negative Q signal.

Aspect 7: The interpolator according to any of Aspects 1-6, further comprising: a first NOR gate configured to control the second switch based on a negative in-phase (I) signal and a negative quadrature (Q) signal; and a second NOR gate configured to control the first switch based on a positive I signal and a positive Q signal.

Aspect 8: The interpolator according to any of Aspects 1-7, further comprising: a second capacitive element; a third current source; a third switch coupled between the second capacitive element and the third current source; a fourth current source; a fourth switch coupled between the second capacitive element and the fourth current source; and a second comparison circuit having an input coupled to the second capacitive element.

Aspect 9: The interpolator of Aspect 8, further comprising: a first logic gate configured to control the fourth switch based on a positive quadrature (Q) signal; and a second logic gate configured to control the third switch based on a negative Q signal.

Aspect 10: The interpolator of Aspect 8 or 9, further comprising: a first logic gate configured to control the fourth switch based on a negative in-phase (I) signal; and a second logic gate configured to control the third switch based on a positive I signal.

Aspect 11: The interpolator according to any of Aspects 8-10, wherein the second capacitive element has a capacitance that is twice a capacitance of the first capacitive element.

Aspect 12: An apparatus comprising the interpolator according to any of Aspects 1-11, wherein: the interpolator comprises multiple outputs; and the apparatus further comprises a non-overlapping clock generator including: a plurality of input nodes coupled to the multiple outputs of the interpolator, respectively; a plurality of output nodes; and a plurality of logic cells, each of the plurality of logic cells comprising: a NAND gate having inputs coupled to two of the input nodes; and a NOR gate having a first input coupled to an output of the NAND gate, a second input coupled to one of the plurality of output nodes, and an output coupled to another one of the plurality of output nodes.

Aspect 13: A method for clock signal generation, comprising: selectively coupling, via a first switch, a first current source to a first capacitive element based on input signals; selectively coupling, via a second switch, a second current source to the first capacitive element based on the input signals; and comparing, via a first comparison circuit, a voltage on the first capacitive element to a first voltage threshold to generate an interpolator output signal.

Aspect 14: The method of Aspect 13, further comprising: charging, via the first current source, the first capacitive element when the first switch is closed; and discharging, via the second current source, the first capacitive element when the second switch is closed.

Aspect 15: The method of Aspect 13 or 14, wherein the first comparison circuit comprises an inverter.

Aspect 16: The method according to any of Aspects 13-15, further comprising control signals for the first switch and the second switch based on at least one of a positive in-phase (I) signal, a negative I signal, a positive quadrature (Q) signal, and a negative Q signal.

Aspect 17: The method according to any of Aspects 13-16, further comprising: generating, via a first logic gate, a first control signal for the second switch and a third switch; generating, via a second logic gate, a second control signal for the first switch and a fourth switch; electively coupling, via the third switch, a third current source to a second capacitive element; selectively coupling, via the fourth switch, a fourth current source to the second capacitive element; and comparing, via a second comparison circuit, a voltage on the second capacitive element to a second voltage threshold.

Aspect 18: The method according to any of Aspects 13-17, further comprising: controlling, via a first NOR gate, the second switch based on a negative in-phase (I) signal and a positive quadrature (Q) signal; and controlling, via a second NOR gate, the first switch based on a positive I signal and a negative Q signal.

Aspect 19: The method according to any of Aspects 13-18, further comprising: controlling, via a first NOR gate, the second switch based on a negative in-phase (I) signal and a negative quadrature (Q) signal; and controlling, via a second NOR gate, the first switch based on a positive I signal and a positive Q signal.

Aspect 20: The method according to any of Aspects 13-19, further comprising: selectively coupling, via a third switch, a third current source to a second capacitive element; selectively coupling, via a fourth switch, a fourth current source to the second capacitive element; and comparing, via a second comparison circuit, a voltage on the second capacitive element to a second voltage threshold.

Aspect 21: The method of Aspect 20, further comprising: controlling, via a first logic gate, the fourth switch based on a positive quadrature (Q) signal; and controlling, via a second logic gate, the third switch based on a negative Q signal.

Aspect 22: The method of Aspect 20 or 21, further comprising: controlling, via a first logic gate, the fourth switch based on a negative in-phase (I) signal; and controlling, via a second logic gate, the third switch based on a positive I signal.

Aspect 23: The method according to any of Aspects 20-22, wherein the second capacitive element has a capacitance that is twice a capacitance of the first capacitive element.

Aspect 24: The method according to any of Aspects 13-23, further comprising: receiving, at a plurality of input nodes, a plurality of input signals having different phases, the plurality of input nodes being coupled to respective outputs of an interpolator including the first switch, the second switch, and the first comparison circuit; and generating, via a plurality of logic cells, a plurality of non-overlapping output signals having different phases, wherein each of the plurality of logic cells comprises: a NAND gate having inputs coupled to two of the input nodes; and a NOR gate having a first input coupled to an output of the NAND gate, a second input coupled to one of a plurality of output nodes, and an output coupled to another one of the plurality of output nodes.

Aspect 25: A clock generator, comprising: a plurality of input nodes; a plurality of output nodes; and a plurality of logic cells, each of the plurality of logic cells comprising: a NAND gate having inputs coupled to two of the input nodes; and a NOR gate having a first input coupled to an output of the NAND gate, a second input coupled to one of the plurality of output nodes, and an output coupled to another one of the plurality of output nodes.

Aspect 26: The clock generator of Aspect 25, wherein the output of the NOR gate of a first one of the plurality of logic cells is coupled to the second input of the NOR gate of a second one of the plurality of logic cells.

Aspect 27: The clock generator of Aspect 25 or 26, wherein the plurality of input nodes are configured to receive a plurality input signals having different phases.

Aspect 28: The clock generator according to any of Aspects 25-27, wherein the clock generator is configured to generate a plurality of non-overlapping output signals having different phases.

Aspect 29: A method for clock signal generation, comprising: receiving, at a plurality of input nodes, a plurality of input signals having different phases; and generating, via a plurality of logic cells, a plurality of non-overlapping output signals having different phases, wherein each of the plurality of logic cells comprises: a NAND gate having inputs coupled to two of the input nodes; and a NOR gate having a first input coupled to an output of the NAND gate, a second input coupled to one of a plurality of output nodes, and an output coupled to another one of the plurality of output nodes.

Aspect 30: The method of Aspect 29, wherein the output of the NOR gate of a first one of the plurality of logic cells is coupled to the second input of the NOR gate of a second one of the plurality of logic cells.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112 (f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An interpolator, comprising:
a first capacitive element;
a first current source;
a first switch coupled between the first capacitive element and the first current source;
a second current source;
a second switch coupled between the first capacitive element and the second current source;
a first comparison circuit having an input coupled to the first capacitive element;
a second capacitive element having a capacitance that is greater than a capacitance of the first capacitive element;
a third current source;
a third switch coupled between the second capacitive element and the third current source;
a fourth current source;
a fourth switch coupled between the second capacitive element and the fourth current source; and
a second comparison circuit having an input coupled to the second capacitive element.

2. The interpolator of claim 1, wherein
the first current source is configured to source a current to the first capacitive element when the first switch is closed; and the second current source is configured to sink a current from the first capacitive element when the second switch is closed.

3. The interpolator of claim 1, wherein the first comparison circuit comprises an inverter.

4. The interpolator of claim 1, further comprising logic having inputs coupled to input nodes of the interpolator and outputs coupled to control inputs of the first switch and the second switch, wherein the logic is configured to generate control signals provided to the first switch and the second switch based on at least one of a positive in-phase (I) signal, a negative I signal, a positive quadrature (Q) signal, or a negative Q signal.

5. The interpolator of claim 1, further comprising:
a first logic gate configured to control the second switch and the third switch; and
a second logic gate configured to control the first switch and the fourth switch.

6. The interpolator of claim 1, further comprising:
a first NOR gate configured to control the second switch based on a negative in-phase (I) signal and a positive quadrature (Q) signal; and
a second NOR gate configured to control the first switch based on a positive I signal and a negative Q signal.

7. The interpolator of claim 1, further comprising:
a first NOR gate configured to control the second switch based on a negative in-phase (I) signal and a negative quadrature (Q) signal; and
a second NOR gate configured to control the first switch based on a positive I signal and a positive Q signal.

8. The interpolator of claim 1, further comprising:
a first logic gate configured to control the fourth switch based on a positive quadrature (Q) signal; and
a second logic gate configured to control the third switch based on a negative Q signal.

9. The interpolator of claim 1, further comprising:
a first logic gate configured to control the fourth switch based on a negative in-phase (I) signal; and
a second logic gate configured to control the third switch based on a positive I signal.

10. The interpolator of claim 1, wherein the capacitance of the second capacitive element is twice the capacitance of the first capacitive element.

11. An apparatus comprising the interpolator of claim 1, wherein:
the interpolator comprises multiple outputs; and
the apparatus further comprises a non-overlapping clock generator including:
a plurality of input nodes coupled to the multiple outputs of the interpolator, respectively;
a plurality of output nodes; and
a plurality of logic cells, each of the plurality of logic cells comprising:
a NAND gate having inputs coupled to two of the input nodes; and
a NOR gate having a first input coupled to an output of the NAND gate, a second input coupled to one of the plurality of output nodes, and an output coupled to another one of the plurality of output nodes.

12. The interpolator of claim 1, wherein
the first comparison circuit is configured to generate a digital signal based on comparison of a voltage at the input of the first comparison circuit with a first threshold voltage; and
the second comparison circuit is configured to generate a digital signal based on comparison of a voltage at the input of the first comparison circuit with a second threshold voltage, the second comparison circuit being different than the first comparison circuit.

13. A method for clock signal generation, comprising:

selectively coupling, via a first switch, a first current source to a first capacitive element based on input signals;

selectively coupling, via a second switch, a second current source to the first capacitive element based on the input signals;

comparing, via a first comparison circuit, a voltage on the first capacitive element to a first voltage threshold to generate an interpolator output signal;

selectively coupling, via a third switch, a third current source to a second capacitive element having a capacitance that is greater than a capacitance of the first capacitive element;

selectively coupling, via a fourth switch, a fourth current source to the second capacitive element; and comparing, via a second comparison circuit, a voltage on the second capacitive element to a second voltage threshold.

14. The method of claim 13, further comprising:

charging, via the first current source, the first capacitive element when the first switch is closed; and discharging, via the second current source, the first capacitive element when the second switch is closed.

15. The method of claim 13, wherein the first comparison circuit comprises an inverter.

16. The method of claim 13, further comprising control signals for the first switch and the second switch based on at least one of a positive in-phase (I) signal, a negative I signal, a positive quadrature (Q) signal, and a negative Q signal.

17. The method of claim 13, further comprising:

generating, via a first logic gate, a first control signal for the second switch and the third switch; and generating, via a second logic gate, a second control signal for the first switch and the fourth switch.

18. The method of claim 13, further comprising:

controlling, via a first NOR gate, the second switch based on a negative in-phase (I) signal and a positive quadrature (Q) signal; and controlling, via a second NOR gate, the first switch based on a positive I signal and a negative Q signal.

19. The method of claim 13, further comprising:

controlling, via a first NOR gate, the second switch based on a negative in-phase (I) signal and a negative quadrature (Q) signal; and controlling, via a second NOR gate, the first switch based on a positive I signal and a positive Q signal.

20. The method of claim 13, further comprising:

controlling, via a first logic gate, the fourth switch based on a positive quadrature (Q) signal; and controlling, via a second logic gate, the third switch based on a negative Q signal.

21. The method of claim 13, further comprising:

controlling, via a first logic gate, the fourth switch based on a negative in-phase (I) signal; and controlling, via a second logic gate, the third switch based on a positive I signal.

22. The method of claim 13, wherein the capacitance of the second capacitive element is twice the capacitance of the first capacitive element.

23. The method of claim 13, further comprising:

receiving, at a plurality of input nodes, a plurality of input signals having different phases, the plurality of input nodes being coupled to respective outputs of an interpolator including the first switch, the second switch, and the first comparison circuit; and generating, via a plurality of logic cells, a plurality of non-overlapping output signals having different phases, wherein each of the plurality of logic cells comprises:

a NAND gate having inputs coupled to two of the input nodes; and a NOR gate having a first input coupled to an output of the NAND gate, a second input coupled to one of a plurality of output nodes, and an output coupled to another one of the plurality of output nodes.

*    *    *    *    *